United States Patent [19]
Watanabe et al.

[11] Patent Number: 5,587,111
[45] Date of Patent: Dec. 24, 1996

[54] METAL PASTE, PROCESS FOR PRODUCING SAME AND METHOD OF MAKING A METALLIC THIN FILM USING THE METAL PASTE

[75] Inventors: Kazuhiro Watanabe, Tsuchiura; Michihiro Oshima, Hachinohe; Kazuhiro Setoguchi, Chiba; Masaaki Oda, Chiba-ken, all of Japan

[73] Assignee: Vacuum Metallurgical Co., Ltd., Chiba-ken, Japan

[21] Appl. No.: 677,190

[22] Filed: Mar. 29, 1991

Related U.S. Application Data

[63] Continuation-in-part of Ser. No. 622,569, Dec. 5, 1990, abandoned.

[30] Foreign Application Priority Data

Mar. 29, 1990 [JP] Japan .................................. 2-81635

[51] Int. Cl.$^6$ .................................................. H01B 1/02
[52] U.S. Cl. ........................... 252/514; 252/513; 252/309
[58] Field of Search ..................... 252/500, 512, 252/513, 514, 308, 309, 62.55; 106/1.11; 75/10.64; 148/513; 427/216–7

[56] References Cited

U.S. PATENT DOCUMENTS

| | | | |
|---|---|---|---|
| 3,814,696 | 6/1974 | Verdone et al. | 252/309 |
| 4,419,663 | 12/1983 | Kohashi | 340/783 |
| 4,493,789 | 1/1985 | Ueyama et al. | 252/512 |
| 4,541,876 | 4/1985 | Hwang | 148/24 |
| 4,552,855 | 11/1985 | Ozin et al. | 502/74 |
| 4,569,924 | 2/1986 | Ozin et al. | 502/184 |
| 4,615,736 | 10/1986 | Armor et al. | 75/251 |
| 4,617,237 | 10/1986 | Gupta et al. | 428/446 |
| 4,652,311 | 3/1987 | Gulla et al. | 106/1.11 |
| 4,725,314 | 2/1988 | Gulla et al. | 106/1.11 |
| 4,859,364 | 8/1989 | Yamamoto et al. | 252/512 |
| 4,871,790 | 10/1989 | Lamanna et al. | 523/333 |
| 4,877,647 | 10/1989 | Klabunde | 427/123 |
| 5,047,379 | 9/1991 | Alyea et al. | 502/79 |

FOREIGN PATENT DOCUMENTS

| | | |
|---|---|---|
| 0263676 | 4/1988 | European Pat. Off. . |
| 1227822 | 10/1966 | Germany . |
| 3134918 | 3/1983 | Germany . |
| 58-076287 | 7/1983 | Japan . |
| 60-161490 | 8/1985 | Japan . |
| 60-162704 | 8/1985 | Japan . |
| 60-192658 | 10/1985 | Japan . |
| 62-11207 | 1/1987 | Japan . |
| 63-034157 | 7/1988 | Japan . |
| 61-112306 | 10/1989 | Japan . |

OTHER PUBLICATIONS

"Production of Ultrafine Gold and Silver particles by a gas evaporation and solvent trap technique" Saito et al, *1988 (CA109:177241) no month available.

"Fractal analysis of the coalescence process of gold nanometer particles dispersed in 2–propanol" Hasegawa et al, *1991 (CA115:79787) no month available.

*Primary Examiner*—Margaret V. Einsmann
*Attorney, Agent, or Firm*—Armstrong, Westerman, Hattori, McLeland & Naughton

[57] ABSTRACT

A metal paste comprising ultrafine particles of a metal. The particles have a particle size of 1000 angstroms (0.1 micron) or less and are individually uniformly dispersed in an organic solvent.

A process for producing a metal paste comprises the steps of evaporating a metal in a vacuum chamber in an atmosphere of an inert gas at a pressure of 10 Torr or less and of collecting the vapor of the evaporated metal on a cooling surface in the form of ultrafine particles having a particle size of 1000 angstroms (0.1 micron) or less, wherein a vapor of an organic solvent is introduced into the vacuum chamber while the metal is being evaporated.

A method for preparing a metallic thin film having a thickness of between 0.01 micron and 1 micron. A metal paste containing ultrafine metal particles having a diameter of 0.1 micron or less uniformly dispersed in an organic solvent is coated on a substrate, dried and sintered.

8 Claims, 7 Drawing Sheets

METAL PASTE, PROCESS FOR PRODUCING SAME AND METHOD OF MAKING A METALLIC THIN FILM USING THE METAL PASTE

This application is a continuation-in-part of prior U.S. patent application Ser. No. 07/622,569 filed Dec. 5, 1990 now abandoned.

BACKGROUND OF THE INVENTION

1. Field of the Invention

This invention relates to a metal paste for use in multilayer wiring of an IC substrate, forming of an electrically conductive transparent film, bonding of a metal with a ceramic, or the like; to a process for producing the metal paste and to a method of making a metallic thin film using the metal paste.

2. Description of the Prior Art

One well-known process for producing ultrafine (superfine) particles of a metal for use in a metal paste of the type described above is a process of evaporation in a gas, the process comprising evaporating the metal in a depressurized atmosphere of an inert gas and collecting the evaporated metal on a cooling portion in the form of ultrafine particles having a particle size of 1000 angstroms (0.1 micron) or less.

The prior art process for producing the metal paste is to withdraw ultrafine metal particles produced, for example, in the above-described process of evaporation in a gas, into the atmospheric air and mix them with an organic solvent. More specifically, referring to FIG. 7, a crucible 6 in an evaporating chamber 1 is heated to evaporate a metal 7 in the crucible 6. The evaporated metal is introduced into a collection chamber 2 and collected in the form of ultrafine metal particles 12 on a cooling plate or a filter 11 maintained at a lower temperature by a coolant 13. The ultrafine metal particles 12 are withdrawn into the atmospheric air and mixed with an organic solvent to provide the metal paste.

With the metal paste produced by the prior art process, however, the particles may be adhered to one another in the course of production of the ultrafine metal particles, thereby producing agglomeration and/or chaining (i.e., connection in the form of a chain) of the particles. In addition, the surfaces of the particles may be oxidized and/or contaminated, resulting in an inferior dispersibility when they are mixed with the organic solvent. Further, because the particles are not individually separated, the density of the ultrafine metal particles in the paste may be lower.

When the metal paste is used, for example, for multilayer wiring in an IC substrate, it is necessary to form a pattern which is fine and has a uniform electric conductivity. When the conventional metal paste is used, however, a fine pattern cannot be formed well and the electric conductivity may not be uniform, because of an inferior dispersibility due to the presence of chained particles. In addition, in sintering the wiring formed from the metal paste, a higher temperature is required because of the oxidized surfaces of the particles. Further, shrinkage and/or cracks may be produced after sintering because of a lower density of the particles in the paste. This also results in an inferior uniformity in the electric conductivity.

Metallic thin films are conventionally used for making conductor circuits such as wiring, electrodes or the like of print circuit boards, thermal heads, condensers or the like. As the methods of making such metallic thin films, the following three are known.

A first method comprises the steps of: preparing an ordinary metallic paste by mixing particles of a metal or of an alloy thereof, whose particle size is 1 micron or more, with an organic solvent, a binder and an additive; and coating the paste on a substrate and drying and sintering them, thereby making a metallic thin film. In this method, the thickness of the metallic thin film is 5 microns or more.

A second method comprises the steps of coating a substrate with a metal-organic substance of liquid state in which a precious metal and an organic material are chemically combined; and drying and sintering them, thereby making a metallic thin film on the substrate. According to this method, it becomes possible to make a metallic thin film of 1 micron thick or less.

A third method comprises the step of making a metallic thin film by using a vacuum process such as a vacuum deposition method, a sputtering method or the like.

In making circuit patterns of a conductive body in the above-described methods, a screen printing method is employed in the first method, a screen printing or photoetching method is employed in the second method, and a photoetching method is employed in the third method, respectively.

In the above-described first method, while the content of metal particles in the metal paste is 50% or more, their particle sizes are 1 micron or more. Therefore, the metallic thin film has a film thickness of as much as 5 to 10 microns. This method thus has problems in that it cannot cope with promoting a decrease in the thickness of the film and that the amount of consumption of gold, platinum, palladium or the like, which is high in material cost, increases, resulting in a product which is high in an overall cost.

In the above-described second method, since the precious metal is present in the organometallic substance in the atomic condition, it is easy to promote a decrease in the thickness of the metallic film. However, since the content of the metallic composition is 20% at most, it is necessary to repeat 2 to 3 times the steps of coating, drying and sintering in order to obtain a thickness of 0.2 to 0.3 micron or more, resulting in a problem in that much time is required for making the film. Further, in this method, the organometallic substance to be used often contains harmful substances such as cyanogen and, therefore, there are problems in safety and hygiene in the step of sintering.

Furthermore, in the third method, since a vacuum batch treatment is required, the productivity is low. In addition, since an easy patterning method such as screen printing or the like cannot be employed, there is a problem in that the productivity is low also in this respect.

Considering the above description of the prior art, it is an object of this invention to provide a metal paste in which the problems associated with the conventional metal paste can be overcome, in which ultrafine metal particles are uniformly dispersed without agglomeration and chaining, and in which the surfaces of the particles are free from oxidation and contamination, and to provide a process for producing such a metal paste.

It is a further object of this invention, considering the problems associated with the above-described three methods of making metallic thin films, to provide a method of making a thinner metallic thin film in an easy way.

SUMMARY OF THE INVENTION

To achieve the above objects, according to this invention, there is provided a metal paste comprising ultrafine particles of a metal, the particles having a particle size of 1000 angstroms (0.1 micron) or less and being individually uniformly dispersed in an organic solvent. In addition, there is provided a process for producing a metal paste, comprising the steps of evaporating a metal in a vacuum chamber in an atmosphere of an inert gas at a pressure of 10 Torr or less and of collecting the vapor of the evaporated metal on a cooling surface in the form of ultrafine particles having a particle size of 1000 angstroms (0.1 micron) or less, wherein a vapor of an organic solvent is introduced into the vacuum chamber while the metal is being evaporated.

Further, there is provided a method of making a metallic thin film characterized in that a metallic thin film which has a range of film thicknesses between 0.01 micron and 1 micron is made with a metallic paste and that the metallic paste comprises ultrafine metallic particles of a metal 0.1 micron or less in diameter dispersed in an organic solvent.

BRIEF DESCRIPTION OF THE DRAWINGS

The above and other objects and the attendant advantages of this invention will become more readily apparent by reference to the following detailed description when considered in conjunction with the accompanying drawings wherein.

DETAILED DESCRIPTION OF PREFERRED EMBODIMENTS

Figure 1:
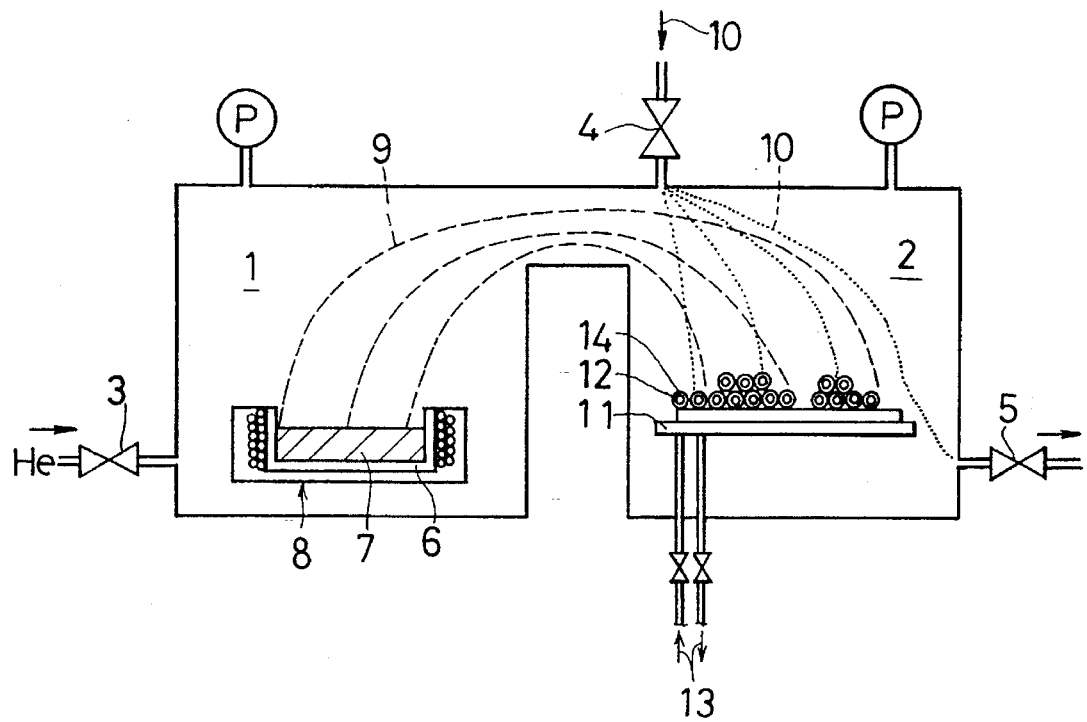
FIG. 1 is a schematic view of an embodiment of an apparatus for carrying out a process for producing a metal paste of this invention.

The metal which may be used in the metal paste and metallic film of this invention is at least one metal of the group comprising silver, gold, nickel, indium, tin, zinc, titanium, copper, chromium, tantalum, tungsten, palladium., platinum, iron, cobalt, silicon, rhodium, iridium, ruthenium and osmium or an alloy of these metals.

Compounds useful as the organic solvent in the method of this invention are compounds which are in the liquid state at a temperature of −20° to 200° C. and a pressure below atmospheric pressure and, in this temperature range, have a viscosity of from 0.5 to 100 cP and a vapor pressure of from $1.0 \times 10^{-4}$ to 100 Torr. Preferred solvents include a solvent containing one or more alcohols having 5 carbon atoms or more such as terpineol, citronellol, geraniol, nerol and phenethyl alcohol, or a solvent containing one or more of organic esters such as ethyl acetate, methyl oleate, ethyl oleate, butyl acetate and glyceride may be used. A suitable one can be selected depending on the purpose of the metal, metallic paste or metallic film.

In order to enhance the adhesion between the metallic thin film and the substrate and to enhance the bonding force among the ultrafine metallic particles, the following bonding agents may be added to the metallic paste. One bonding agent may be B, Si, Pb, an oxide of each of them, or the like, which agent softens in the process of heat treatment and penetrates into the particle layers on the substrate, thereby enhancing the adhesion between the two and enhancing the bonding force among the particles. Another bonding agent may be Cu, Zn, Bi, an oxide of each of them, or the like, which bonding agent chemically bonds with the substance of the substrate in the process of heat treatment, thereby enhancing the combination between the two. It is preferable to use the bonding agents in the form of highly dispersed ultrafine particles.

Further, a high molecular weight substance such as ethyl cellulose may be added to the metallic paste to adjust the viscosity, thereby obtaining optimum screen printing characteristics.

Still further, a surface active agent such as lauryl betaine, cocoyl amidopropyldimethyl aminoacetic acid betaine, or the like may be added to the metallic paste to enhance the dispersion stability of the ultrafine metallic particles in the metallic paste, thereby eliminating a change with the passage of time due to coagulation of the particles.

In the process of this invention for producing the metal paste, ultrafine metal particles are produced in an inert gas atmosphere, and the surface of each of the particles is covered with an organic solvent. Therefore, the ultrafine metal particles cannot be chained with one another, and the surfaces of the ultrafine particles cannot also be oxidized. The particles produced have a particle size of about 1000 angstroms (0.1 micron) or less and typically of from about 10 angstroms (0.001 micron) to about 100 angstroms.

The metal paste formed in the above manner is capable of forming a fine pattern having a uniform electric conductivity when it is used, for example, for multilayer wiring in an IC substrate or the like. In this case, the wiring can be sintered at a lower temperature.

In the method of this invention for making a metallic thin film, the metallic film can be made, basically in the same way as in the above-described first method, by coating a substrate with the above-described metallic paste and then drying and sintering the paste. A thickness of the produced metallic film of 1 micron or less can be attained. Further, when this metallic film is used in a conductive circuit, it is also possible to attain a film thickness required for the conductive circuit, i.e., 0.3 micron or more, by going through a single step of coating, drying and sintering.

FIG. 1 is a schematic view of an example of an apparatus for manufacturing a metal paste according to a first embodiment of this invention.

The apparatus for manufacturing the metallic paste is provided with an evaporating chamber 1 and a collection chamber 2, both being in communication with each other. A helium gas passage is connected to the evaporating chamber 1 for introducing helium gas thereinto. A valve 3 for opening and closing this passage is provided in the passage. A passage for introducing an organic solvent vapor 10 into the collection chamber 2 is connected to the collection chamber 2 in the neighborhood of that connecting portion of the collection chamber 2 at which the vacuum chamber 1 is connected to the collection chamber 2. In the passage for introducing the organic solvent vapor 10, there is provided a valve 4 for opening and closing the passage. To the collection chamber 2, there is further connected an exhausting passage which is connected to a vacuum pump (not shown) for evacuating the collection chamber 2. This passage is provided with a valve 5 for opening and closing the passage.

Inside the evaporating chamber 1 there is disposed a crucible 6 which contains therein a metal 7 to be used. This crucible 6 is provided with a high-frequency induction heating apparatus 8 for heating the metal 7 inside the crucible 6. On the other hand, the collection chamber 2 is provided therein with a cooling plate 11. This cooling plate 11 is constantly cooled by a coolant which is caused to be circulated by means of a coolant circulating passage 13.

In the following examples, metallic pastes were made by using the apparatus as described above.

This invention will now be described by way of embodiments with reference to the accompanying drawings.

EXAMPLE 1

Figure 2A:
FIGS. 2A and 2B are transmission electron microscope photographs showing the particles of a copper paste produced by the embodiment of Example 1 and a copper paste produced by a prior art process, respectively.

With valves 3 and 4 closed, the apparatus was evacuated by a vacuum pump (not shown) through a valve 5 to reduce the pressure in an evaporating chamber 1 and a collection chamber 2 down to a level of $10^{-6}$ Torr. Then, evacuation through the valve 5 was continued, while introducing helium gas into the evaporating chamber 1 with the valve 3 opened, thereby maintaining the interior of the evaporating chamber at a helium gas pressure of 1 Torr. Copper (Cu) 7 in a crucible 6 placed in the evaporating chamber 1 was heated by a high frequency induction heater 8 to produce a vapor of copper 9 while introducing a vapor of α-terpineol into the collection chamber 2 with the valve 4 opened. The copper vapor 9 was carried from the evaporating chamber 1 into the collection chamber 2 by the gas flow and condensed in this flow to form ultrafine particles of copper. The ultrafine particles were mixed with the vapor of α-terpineol in the collection chamber 2, with the result that stabilized ultrafine particles of copper, each covered with a thin film of α-terpineol, were deposited on a cooling plate 11 kept at a lower temperature by a coolant 13. The covered particles were collected, and observation thereof by a transmission electron microscope showed that the particles of copper were neither agglomerated nor chained, but were uniformly dispersed in an isolated manner in the α-terpineol. It is believed that this is because the ultrafine particles of copper are well mixed with the vapor of α-terpineol and hence they are each wrapped with a film of α-terpineol before being adhered to one another. The obtained transmission electron photomicrograph is shown in FIG. 2A.

As can be seen from this photomicrograph the ultrafine particles of copper are not only unchained but also are dispersed in an isolated manner in the solvent with a higher density. The shape of the particles is spherical and uniform, and the particle size is 200 angstroms (0.02 micron) on an average.

Figure 2B:
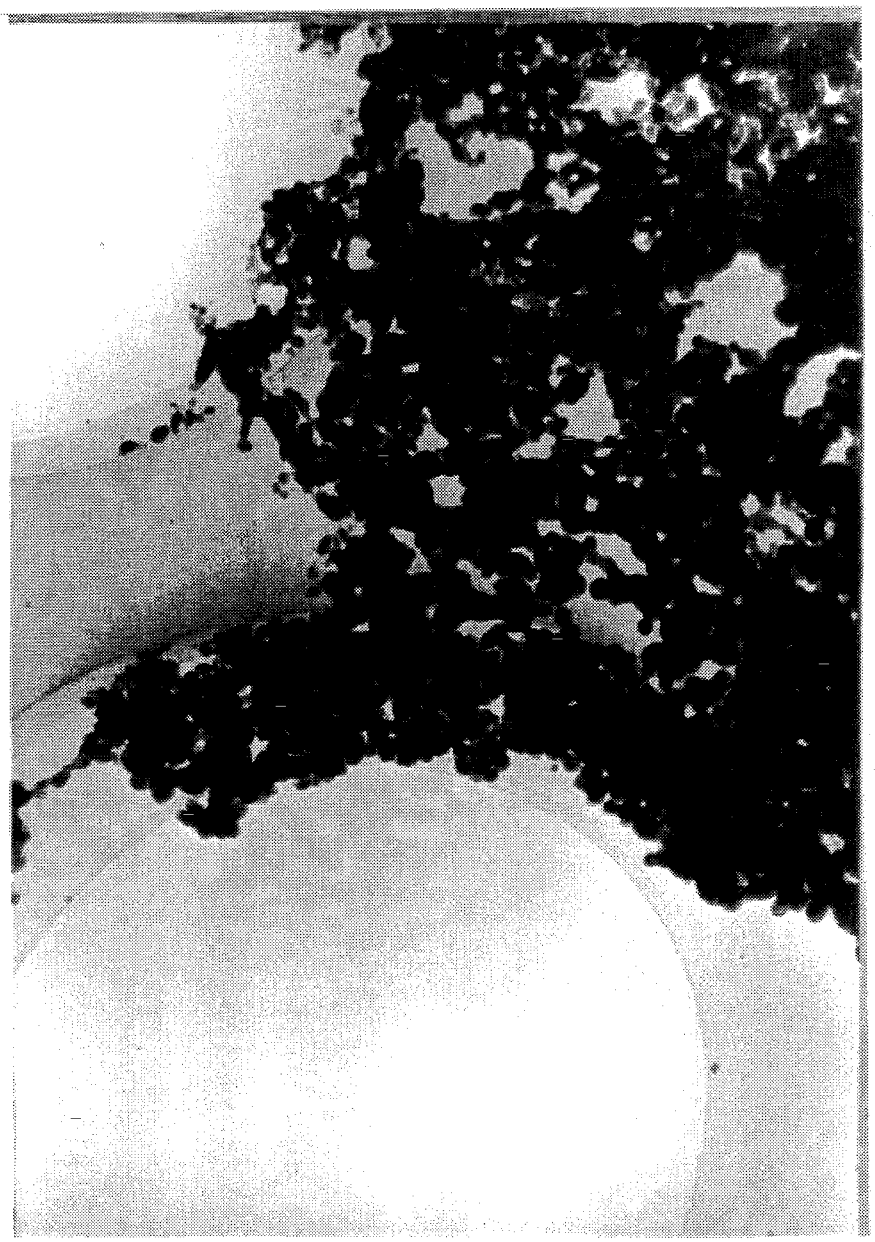

For comparison, ultrafine particles of copper were produced in the prior art process without introduction of the vapor of α-terpineol and collected into atmospheric air. They were mixed with α-terpineol to provide a metal paste. The photomicrograph from observation of this comparative sample by a transmission electron microscope is shown in FIG. 2B. As can seen from the photomicrograph, the particles of copper were mostly adhered in a chained manner, and the density of the dispersion as a whole was lower and, moreover, the dispersion was not uniform.

Figure 3:
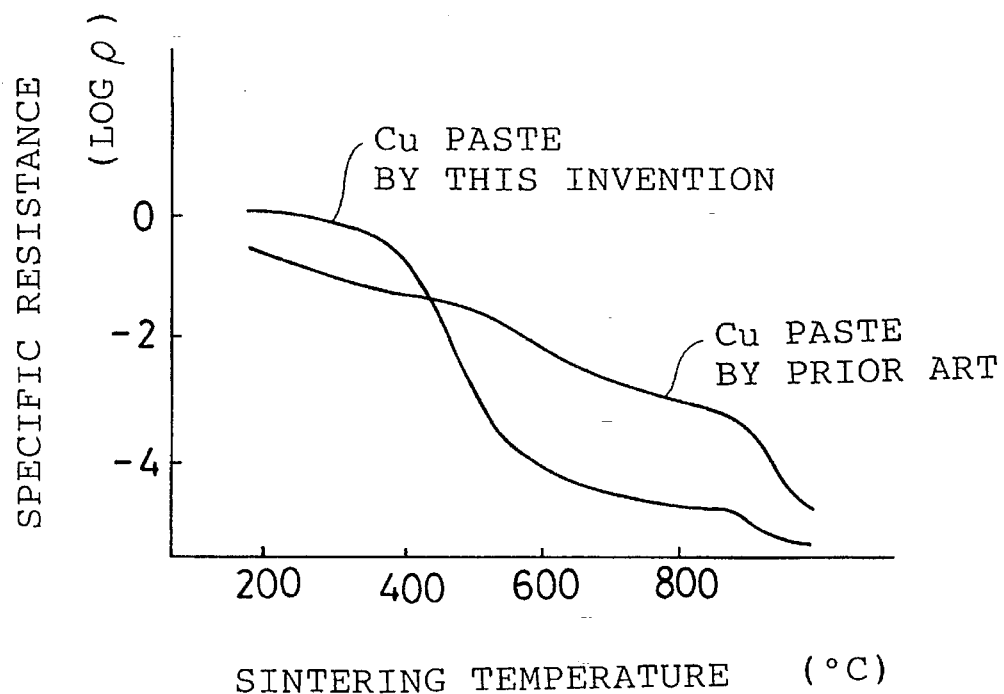
FIG. 3 is a graph illustrating the variation in specific resistance of wiring relative to the sintering temperature when the copper paste produced by the embodiment of Example 1 and the copper paste produced by the prior art process are used for formation of wiring patterns.

Using the copper pastes produced by the process of this embodiment and by the prior art process, patterns of wiring having a width of 3 microns each were formed on an alumina substrate and sintered in a nitrogen gas atmosphere. The variation in specific resistance of the wiring relative to the sintering temperature is shown in FIG. 3. At a sintering temperature of 400 degrees C. or below, the paste of this invention is higher in specific resistance than the prior art paste. It is believed that this is because the individual particles of copper are each covered, or wrapped, with the solvent and thus isolated. As the sintering temperature is increased, the specific resistance of the prior art paste is reduced only little by little. However, the specific resistance of the paste of this invention is suddenly reduced at 400 degrees C. This indicates that the densification and sintering of the copper particles in the paste advanced rapidly. It is believed that this is because: the copper particles are originally present in the paste with a higher density; further, since there are no chained particles, the densification by the sintering advances rapidly; and further sintering may be started at a lower temperature because of unoxidized surfaces of the particles.

Accordingly, it can be seen from FIG. 3 that, with the prior art paste, the sintering temperature needed to be increased up to 800 degrees C., whereas with the copper paste of this example, 500 degrees C. suffices.

In addition, with the paste of this example, no shrinkages and no cracks were produced even after sintering.

EXAMPLE 2

Figure 4A:
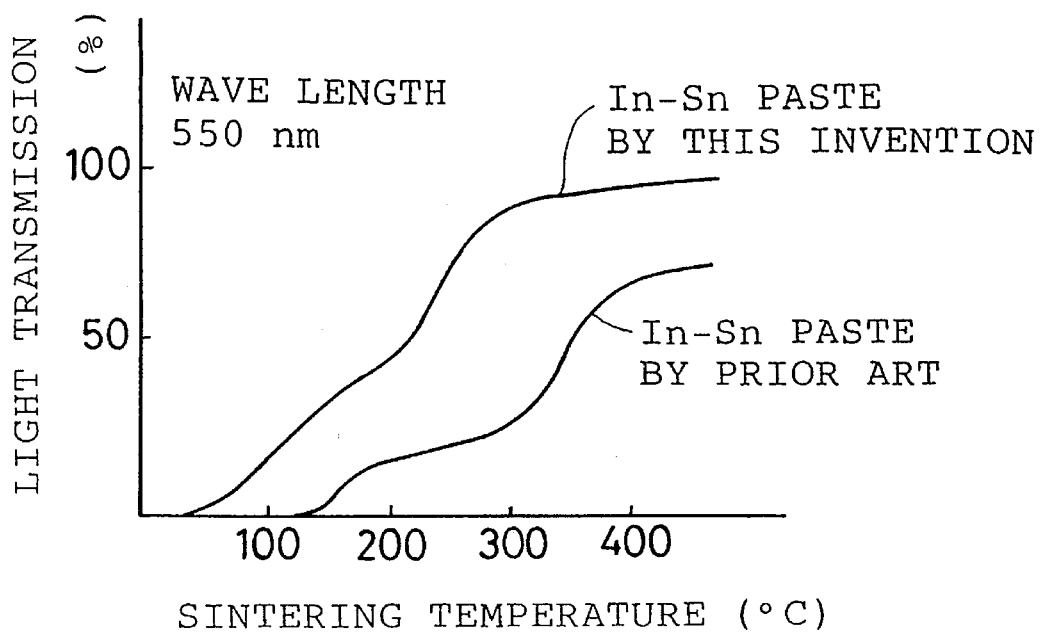
FIGS. 4A and 4B are graphs illustrating variations in light transmission and electric resistivity relative to the sintering temperature when an indium-tin paste produced by the embodiment of Example 2 and an indium-tin paste produced by the prior art process are used for formation of transparent conductive films, respectively.
Figure 4B:
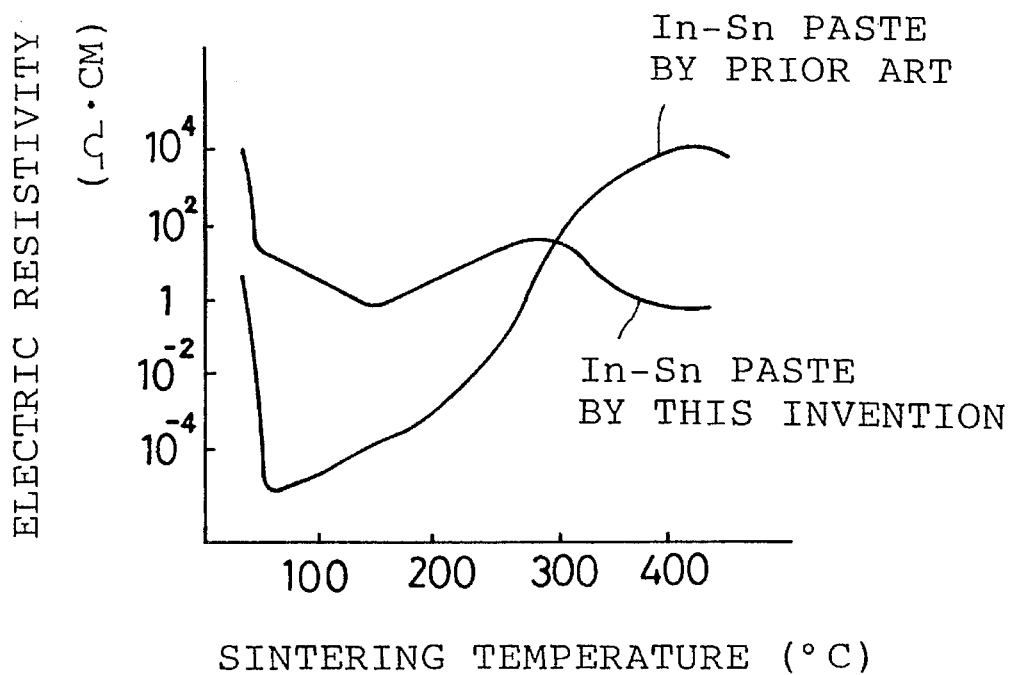

Using the same apparatus as in Example 1, indium (In) was evaporated under a helium gas pressure of 0.5 Torr, and a vapor of methyl oleate was introduced as an organic solvent, thus producing an indium paste. Further, using tin (Sn) under the same conditions in place of indium, a tin paste was produced. The average particle sizes of the metal particles in the pastes were 100 angstroms (0.01 micron) and 70 angstroms (0.007 micron), respectively. A mixture of the indium paste and the tin paste at a ratio by weight of 95 to 5 was applied to a thickness of 5 microns onto a glass substrate and sintered in atmospheric air to provide a transparent conductive film. Both the paste of this embodiment and the indium-tin paste produced by the prior art process were measured for light transmission and electric resistivity relative to the sintering temperature. The results are shown in FIGS. 4A and 4B. As is apparent from these figures, the film produced using the paste of this example is more excellent in both light transmission and electric conductivity than the film produced from the prior art paste. In addition, the film produced in this example is denser than that produced from the prior art paste and is free from any pin holes and cracks.

EXAMPLE 3

Figure 5A:
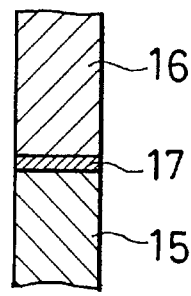
FIG. 5A is a diagram illustrating the bonding between a stabilized zirconia and a stainless steel bar by use of a titanium paste produced by the embodiment of Example 3.
Figure 5B:
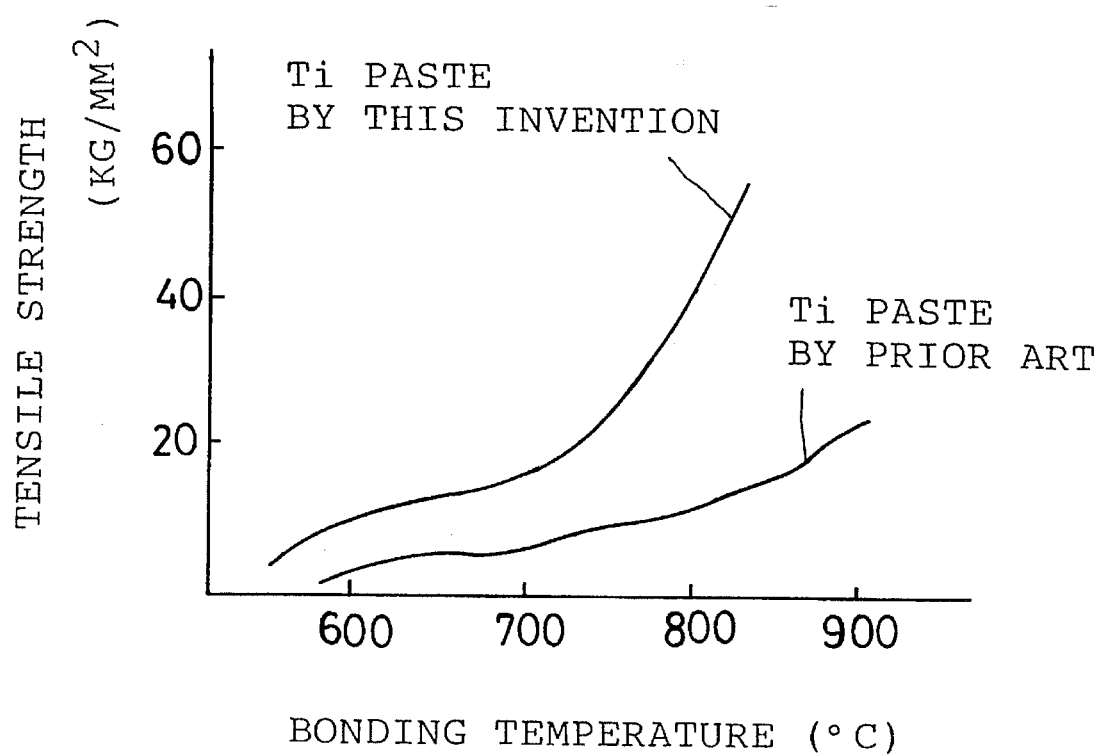
FIG. 5B is a graph illustrating the variation in tensile strength of a bonded portion relative to the bonding temperature when the titanium paste produced by the embodiment of Example 3 and the titanium paste produced by the prior art process are used for bonding stabilized zirconia and stainless steel bar.

Using the same apparatus as in Example 1, titanium (Ti) was evaporated under the condition of a helium gas pressure of 0.8 Torr, and a vapor of butyl acetate was introduced as an organic solvent, thus producing a titanium paste. The average particle size of titanium particles in the paste was about 120 angstroms (0.012 micron). The titanium paste 17 was placed between a stabilized zirconia 15 and a stainless steel bar 16 and sintered to bond them, as shown in FIG. 5A. In addition, using a titanium paste produced by the prior art process, a stabilized zirconia and a stainless steel bar was likewise bonded. The bonding provided by the paste of this example and the prior art paste was measured for tensile strength of the bonding paste relative to the bonding temperature. The results are shown in FIG. 5B. As is apparent from this figure, the use of the paste of this example provided a larger bonding strength.

EXAMPLE 4

Using the same apparatus as in Example 1, silver (Ag) was evaporated under the condition of a helium gas pressure of 0.5 Torr, and a vapor of a mixture of glyceride linoleate, glyceride linolenate and glyceride oleate was introduced as an organic solvent, thus producing a silver paste. In this case, the vapor of the mixed solvent was introduced in the following manner: components of the mixture were individually placed into different containers and heated. The temperatures of the liquids were adjusted to produce predetermined amounts of vapors. They were mixed in a heated pipe, and then the resulting mixture was introduced into the collection chamber 2 through the valve 4. The resulting silver paste contained silver particles of an average particle size of 60 angstroms (0.006 micron). Further, because the mixed solvent was used, agglomeration of the silver particles was not produced even if the resulting paste was left to stand in a plugged (or sealed) condition for a long period of time in an environment of a relatively high temperature. For example, even when the paste was left to stand for 168 hours in a thermostatic chamber at 60 degrees C., agglomeration was not produced and, thus, the paste exhibited a higher stability.

EXAMPLE 5

Using the same apparatus as in Example 1, platinum (Pt) was evaporated under the condition of a helium gas pressure of 0.5 Torr, and a vapor of a mixture of citronellol, geraniol, phenethyl alcohol and nerol was introduced as an organic solvent, thus producing a platinum paste. The vapor of the mixed organic solvent was introduced in the same manner as in the fourth embodiment. The resulting platinum paste contained platinum particles of an average particle size of 80 angstroms (0.008 micron).

EXAMPLE 6

Using the same apparatus as in Example 1, palladium (Pd) was evaporated under the condition of a helium gas pressure of 0.5 Torr, and a vapor of a mixture of methyl oleate and a surfactant of a certain type was introduced as an organic solvent, thus producing a palladium paste. The vapor of the mixture as the organic solvent was introduced in the same manner as in Example 4. The produced palladium paste contained palladium particles of an average particle size of 60 angstroms (0.006 micron). Further, wettability of the paste onto a glass substrate was improved, and a higher stability of dispersion was exhibited, because the surfactant was included.

EXAMPLE 7

Using the same apparatus as in Example 1, gold (Au) was evaporated under a helium gas pressure of 1 Torr, and a vapor of $\alpha$-terpineol was introduced as an organic solvent, thus producing superfine gold particles dispersed in the $\alpha$-terpineol. The gold particles were spherical in shape and uniform and had an average particle size of 100 angstroms (0.01 micron).

The particles thus obtained were mixed together by adding a dispersing agent and a bonding agent to obtain the metallic paste. The composition of this metallic paste was, on a weight basis, 40% of gold, 1% of dispersing agent, 5% of bonding agent and 54% of solvent.

A conductive film was made by using the above-described metallic paste.

First, by using a 400-mesh screen, fine line-and-space patterns of 50—50 microns were formed on an aluminum substrate with the above-described metallic paste. The coating thickness of the metallic paste was about 12 microns. The fine patterns were dried by keeping them at 120° C. for 15 minutes in the atmosphere. They were then sintered in a muffle furnace under conditions of a peak temperature of 850° C. and a retention time of 10 minutes, thereby making the conductive film.

The thickness of the conductive film became 0.5 micron, and a resistance value of 90 m$\Omega$/□ (0.5 micron) was obtained. This film thickness of 0.5 micron is about one third of the minimum film thickness of 1.5 micron that was obtainable with a conventional metallic paste, thus enabling a still thinner film thickness. In point of the resistance value, too, it was possible to obtain a value which is not far different from a conventional value; therefore, there was no problem in putting it into practical use. In addition, the deviation in the resistance value from line to line was small, thus verifying the feature of a paste of highly dispersed particles.

Figure 8:
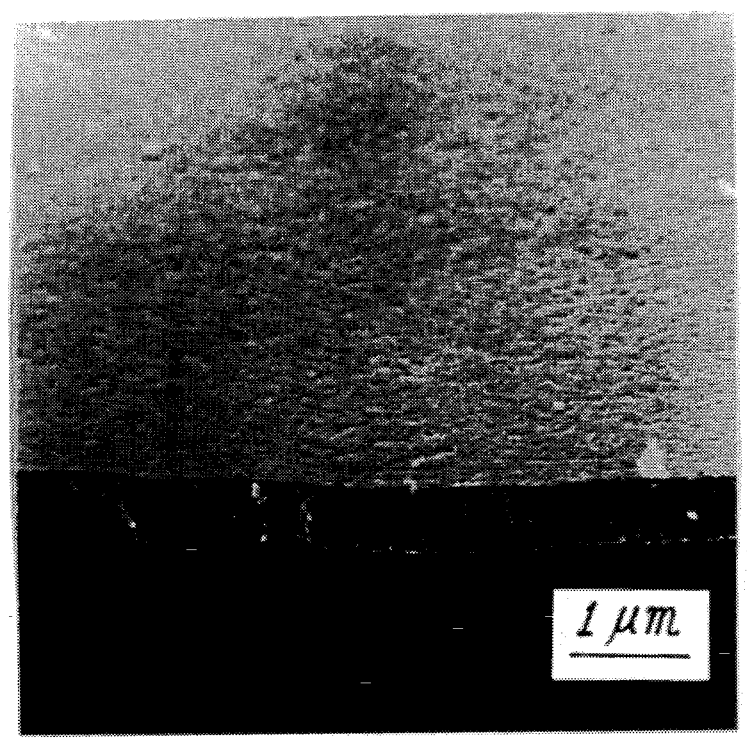
FIG. 8 is a scanning electron microscope photograph of the conductive film made according to the embodiment of Example 7.

When the surface of the metallic thin film thus obtained was observed by an SEM (scanning electron microscope), it was confirmed, as shown in FIG. 8, that a smooth surface free from pin holes was obtained. Further, in order to test the adhesiveness of the metallic thin film on the substrate, an ultrahigh-frequency treatment was performed at 28 kHz and 100 W for 60 minutes. But there was found no phenomenon of peeling off or the like.

EXAMPLE 8

By using the same apparatus as in Example 1, gold metal was evaporated under a condition of helium pressure of 10 Torr. By using butyl acetate as the organic solvent, a gold metal paste in which gold metal particles are highly dispersed was prepared. By using this metal paste a conductive film was made. The particle size of the above-described gold metal particles was 0.1 micron. The composition of this metallic paste was, on weight basis, 60% of gold metal, 1% of dispersing agent, 5% of bonding agent and 34% of solvent.

A conductive film was made by using the above-described metallic paste.

First, by using a 400-mesh screen, fine line-and-space patterns of 50—50 microns were formed on an aluminum substrate with the above-described metallic paste. The coating thickness of the metallic paste was about 16 microns. The fine patterns were dried by keeping them at 120° C. for 15 minutes in the atmosphere. They were then sintered in a muffle furnace under conditions of a peak temperature of 850° C. and a retention time of 10 minutes, thereby making the conductive film. The thickness of the conductive film produced became 1.0 micron, and a resistance value of 40 mΩ/□ (1.0 micron) was obtained. As a result of this, it was shown that, as in Example 7, the conductive film had characteristics which were superior to those of the conventional paste for thick films or the organometallic paste.

Upon observation by an SEM, the surface of the conductive film which was made in this embodiment was found to be smooth without pin holes. Also, good results were obtained in a peeling test.

EXAMPLE 9

By using the same apparatus as in Example 1, gold metal was evaporated under a condition of helium pressure of 0.1 Torr. By using citronellol as the organic solvent, a gold metal paste in which gold metal particles are highly dispersed was prepared. By using this metal paste a conductive film was made. The particle size of the above-described gold metal particles was 0.001 micron. The composition of this metallic paste was, on a weight basis, 14% of gold metal and 86% of solvent.

A conductive film was made by using the above-described metallic paste.

By using a 400-mesh screen, a conductive film was formed on a glass substrate with the above-described metallic paste. The coating thickness of the metallic paste was about 1.2 microns. The film was dried by keeping it at 120° C. for 15 minutes in the atmosphere. It was then sintered in a muffle furnace under conditions of a peak temperature of 800° C. and a retention time of 10 minutes, thereby making the conductive film. The thickness of the conductive film produced became 0.01 micron, and a resistance value of 10 Ω/□ (0.01 micron) was obtained.

Upon observation by an SEM, the surface of the conductive film which was made in this embodiment was found to be smooth without pin holes.

EXAMPLE 10

By using the same apparatus as in Example 1, a silver alloy containing, on a weight basis, 25% palladium was evaporated under a condition of helium pressure of 0.5 Torr. By using α-terpineol as the organic solvent, an alloy metal paste in which silver-palladium alloy particles are highly dispersed was prepared. By using this metal paste a conductive film was made. The particle size of the above-described silver-palladium alloy particles was 0.02 micron. The composition of this metallic paste was, on a weight basis, 50% of silver-palladium alloy, 0.5% of dispersing agent, 5% of bonding agent and 44.5% of solvent.

A conductive film was made by using the above-described metallic paste.

First, by using a 400-mesh screen, fine line-and-space patterns of 50—50 microns were formed on an aluminum substrate with the above-described metallic paste. The coating thickness of the metallic paste was about 8 microns. The fine patterns were dried by keeping them at 120° C. for 15 minutes in the atmosphere. They were then sintered in a muffle furnace under conditions of a peak temperature of 900° C. and a retention time of 10 minutes, thereby making the conductive film. The thickness of the conductive film produced became 0.8 micron, and a resistance value of 180 mΩ/□ (0.8 micron) was obtained. As a result of this, it was shown that, as in Example 7, the conductive film had characteristics which were superior to those of the conventional paste for thick films or the organometallic paste.

Upon observation by an SEM, the surface of the conductive film which was made in this embodiment was found to be smooth without pin holes. Also, good results were obtained in a peeling test.

Although various embodiments of this invention have been described above, it will be understood that this invention is not limited thereto and various modifications and variations can be made on the basis of the technical idea of this invention.

For example, although the evacuating valve 5 has been provided only in the collection chamber 2 and the evaporating chamber 1 and the collection chamber 2 were evacuated together in the embodiments, evacuating valves may be provided in both the evaporating chamber 1 and the collection chamber 2, respectively, and these chambers may be evacuated separately. In this case, it is necessary to bring the collection chamber 2 to a lower pressure so that the vapor of metal may be transferred from the evaporating chamber 1 to the collection chamber 2 by a difference in pressure.

A cooling plate 11 for collecting the ultrafine particles of a metal has been used in the collection chamber 2 in the illustrated embodiments, but in place thereof, a cooling filter may be used, or without provision of the cooling plate and the cooling filter, the entire collection chamber 2 may be cooled to collect the ultrafine particles on the inner wall surface thereof.

Figure 6:
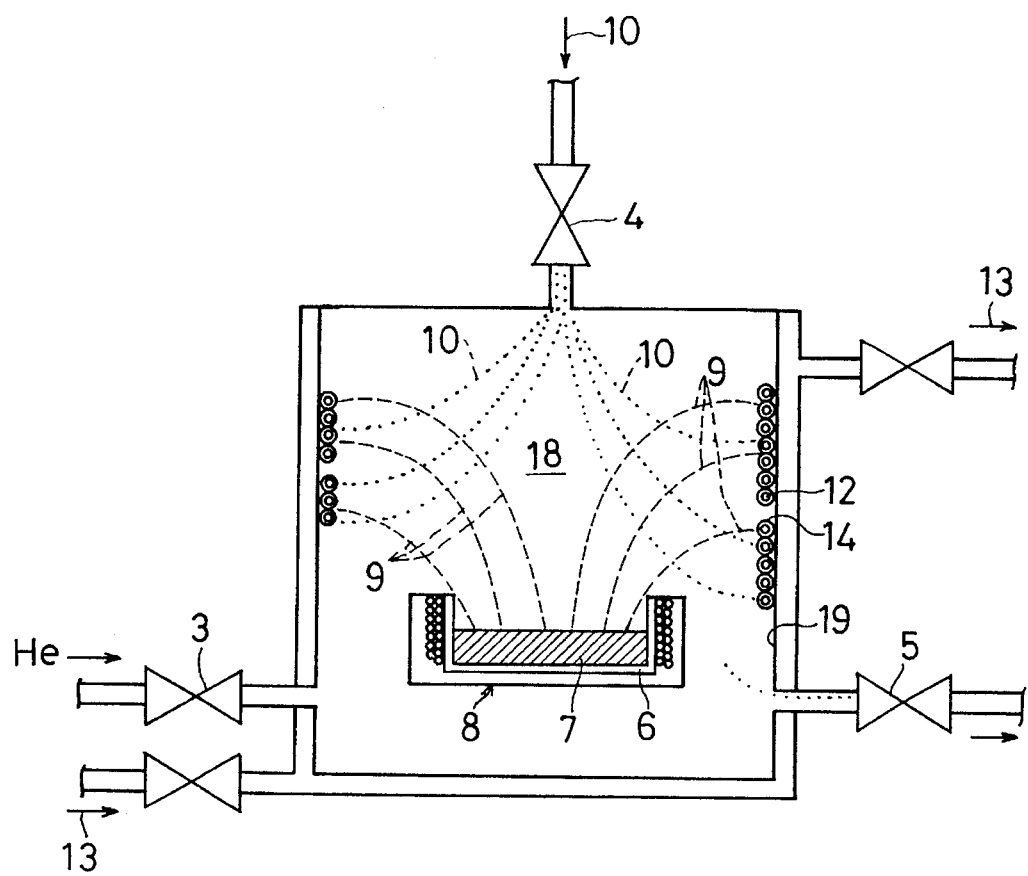
FIG. 6 is a schematic view of an apparatus for carrying out a process for producing a metal paste in accordance with a modification of this invention.
Figure 7:
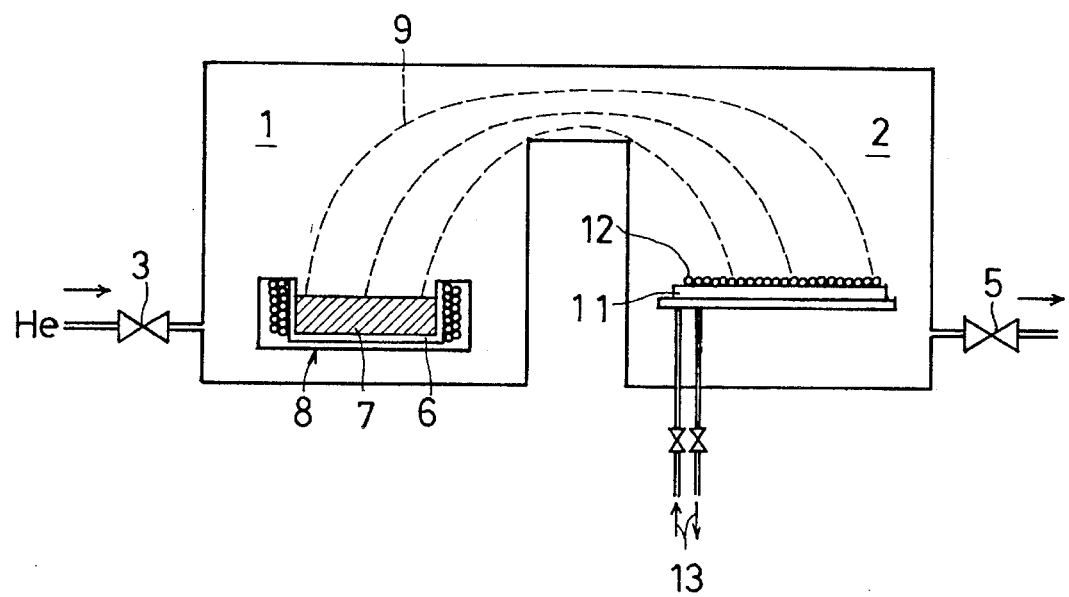
FIG. 7 is a schematic view of one example of an apparatus for producing ultrafine particles of a metal by the prior art process.

In addition, although the evaporating chamber 1 and the collection chamber 2 have been provided separately in the embodiments, only a single vacuum chamber 18 may be provided as shown in FIG. 6, and a metal may be heated and evaporated in the vacuum chamber while, at the same time, the vapor of an organic solvent is introduced. The particles may thus be collected on the cooling wall surface 19 of the vacuum chamber 18.

The size of metal particles precipitated can be controlled by the pressure of the inert gas, the vapor pressure of and the temperature of evaporation of the metal, and the like, but a size in the range of 1000 angstroms (0.1 micron) or less is preferred. This is because if particles having a size more than 1000 angstroms are used for a wiring pattern, the formation of a fine pattern becomes inferior. In addition, when the particles are sintered, their degree of sintering is inferior, resulting in a higher resistance value. In addition to those used in the above embodiments, it is possible to use an organic solvent comprising one or more properly selected from alcohols having 5 carbon atoms or more, or organic esters depending on the kinds of metals. As the method of evaporating the metal, it is possible to utilize, in addition to the induction heating used in the embodiments, electric resistance heating, electron beam heating, laser beam heating or a sputtering process, which are usually used in a gas evaporation method.

Further, besides helium gas, other inert gases such as argon gas may be used as a carrier gas.

This invention has the features described above and, therefore, it is possible to provide a metal paste in which ultrafine particles free from surface oxidation are uniformly dispersed with a higher density and without chaining.

Accordingly, if the metal paste is used, for example, for wiring in an IC substrate, a very fine pattern can be formed. In addition, the metal paste can be sintered at a lower temperature with a smaller thermal strain, because the particles are free from oxidation on the surface thereof.

Further, when the paste is sintered, the amount of change is smaller, and no cracking is produced, because ultrafine metal particles are dispersed in the paste with a higher density.

Also, as described above, according to this invention, it is possible to make considerably thin and fine metallic thin films in a simple method. As a result, the amount of precious metals to be used can be reduced to a smaller amount, and the cost of manufacturing the metallic thin film is considerably reduced. In addition, when electronic parts are manufactured by using this metallic thin film, their sizes can further be made smaller.

It is readily apparent that the above-described invention has the advantage of wide commercial utility. It should be understood, however, that the specific form of the invention hereinabove described is intended to be representative only, as certain modifications within the scope of these teachings will be apparent to those skilled in the art.

Accordingly, reference should be made to the following claims in determining the full scope of the invention.

What is claimed is:

1. A metal paste comprising at least 14 wt. % of ultrafine particles of gold individually uniformly dispersed in a solvent consisting essentially of at least one organic compound, said particles having a particle size of 100 angstroms or less and each particle having its entire surface covered with the solvent.

2. A metal paste according to claim 1, wherein said paste further comprises ultrafine particles of at least one metal selected from the group consisting of silver, nickel, indium, tin, zinc, titanium, copper, chromium, tantalum, tungsten, palladium, platinum, iron, cobalt, silicon, rhodium, iridium, ruthenium and osmium and alloys thereof, said particles of at least one metal having a particle size of 1000 angstroms or less and each particle having its entire surface covered with the solvent.

3. A metal paste in accordance with claim 1, wherein the paste contains up to 60 wt. % ultrafine particles of gold.

4. A metal paste in accordance with claim 2, wherein the paste contains up to 60 wt. % ultrafine particles of gold.

5. A metal paste comprising at least 14 wt. % of ultrafine particles of gold individually uniformly dispersed in a solvent consisting essentially of at least one organic compound, said particles having a particle size of 100 angstroms or less and each particle having its entire surface covered with the solvent, the solvent containing one or more alcohols having 5 carbon atoms or more, or a solvent containing one or more organic esters.

6. A metal paste according to claim 5, wherein said paste further comprises ultrafine particles of at least one metal selected from the group consisting of silver, nickel, indium, tin, zinc, titanium, copper, chromium, tantalum, tungsten, palladium, platinum, iron, cobalt, silicon, rhodium, iridium, ruthenium and osmium and alloys thereof, said particles of at least one metal having a particle size of 1000 angstroms or less and each particle having its entire surface covered with the solvent.

7. A metal paste in accordance with claim 5, wherein the paste contains up to 60 wt. % ultrafine particles of gold.

8. A metal paste in accordance with claim 6, wherein the paste contains up to 60 wt. % ultrafine particles of gold.

* * * * *